(12) United States Patent
Ma et al.

(10) Patent No.: US 10,157,975 B2
(45) Date of Patent: Dec. 18, 2018

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Wei-Yu Ma, Taitung (TW); Chia-Hui Chen, Hsinchu (TW); Yi-Ting Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/478,294

(22) Filed: Apr. 4, 2017

(65) Prior Publication Data
US 2017/0207295 A1    Jul. 20, 2017

Related U.S. Application Data

(62) Division of application No. 14/693,927, filed on Apr. 23, 2015, now Pat. No. 9,640,605.

(60) Provisional application No. 62/139,887, filed on Mar. 30, 2015.

(51) Int. Cl.
| | |
|---|---|
| *G01R 31/26* | (2014.01) |
| *H01L 49/02* | (2006.01) |
| *H01L 27/06* | (2006.01) |
| *H01L 29/93* | (2006.01) |
| *H01L 27/02* | (2006.01) |
| *G06F 17/50* | (2006.01) |
| *H01L 27/08* | (2006.01) |

(52) U.S. Cl.
CPC .......... *H01L 28/20* (2013.01); *G06F 17/5072* (2013.01); *G06F 17/5081* (2013.01); *H01L 27/0207* (2013.01); *H01L 27/0629* (2013.01); *H01L 27/0682* (2013.01); *H01L 29/93* (2013.01); *H01L 27/0802* (2013.01)

(58) Field of Classification Search
CPC ........................ H01L 27/0288; H01L 27/3281
USPC ............................ 257/379, 528, 529; 438/14
See application file for complete search history.

(56) References Cited

U.S. PATENT DOCUMENTS

| | | | |
|---|---|---|---|
| 6,841,810 | B1 | 1/2005 | Jeffery |
| 8,421,205 | B2 | 4/2013 | Yang |
| 8,661,389 | B2 | 2/2014 | Chern et al. |
| 8,698,205 | B2 | 4/2014 | Tzeng et al. |
| 8,826,212 | B2 | 9/2014 | Yeh et al. |
| 8,836,141 | B2 | 9/2014 | Chi et al. |
| 2014/0215420 | A1 | 7/2014 | Lin et al. |
| 2014/0264924 | A1 | 9/2014 | Yu et al. |

(Continued)

*Primary Examiner* — Tan N Tran
(74) *Attorney, Agent, or Firm* — Hauptman Ham, LLP

(57) ABSTRACT

A method includes determining an active region pattern density of a first region of an integrated circuit layout based on a total area of each active region in the first region and an area of the first region. The method includes determining an active region pattern density of a second region of the integrated circuit layout based on a total area of each active region in the second region and an area of the second region. The method includes determining an active region pattern density gradient between the first region to the second region. The method includes determining whether the first region or the second region includes a resistive device. The method includes modifying a portion of the resistive device to include an incremental resistor in response to the first region or the second region including the resistive device.

20 Claims, 8 Drawing Sheets

(56) References Cited

U.S. PATENT DOCUMENTS

2014/0282289 A1  9/2014  Hsu et al.
2014/0325466 A1  10/2014 Ke et al.

METHOD OF MANUFACTURING A SEMICONDUCTOR DEVICE

PRIORITY CLAIM

The present application is a divisional of U.S. application Ser. No. 14/693,927, filed Apr. 23, 2015, which claims the priority of U.S. Provisional Application No. 62/139,887, filed Mar. 30, 2015, which are incorporated herein by reference in their entireties.

BACKGROUND

The recent trend in miniaturizing integrated circuits (ICs) has resulted in smaller devices which consume less power yet provide more functionality at higher speeds. However, the miniaturization process has also resulted in stricter design and manufacturing specifications as well as reliability challenges. For one or more of these advantages to be realized, various developments in IC design and/or manufacture are considered including across-chip layout uniformity. The semiconductor manufacturing process yields semiconductor devices that possess physical variations across the device, in some instances. Physical variations lead to electrical variations in the semiconductor devices operation leading to semiconductor function failure, in some instances.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
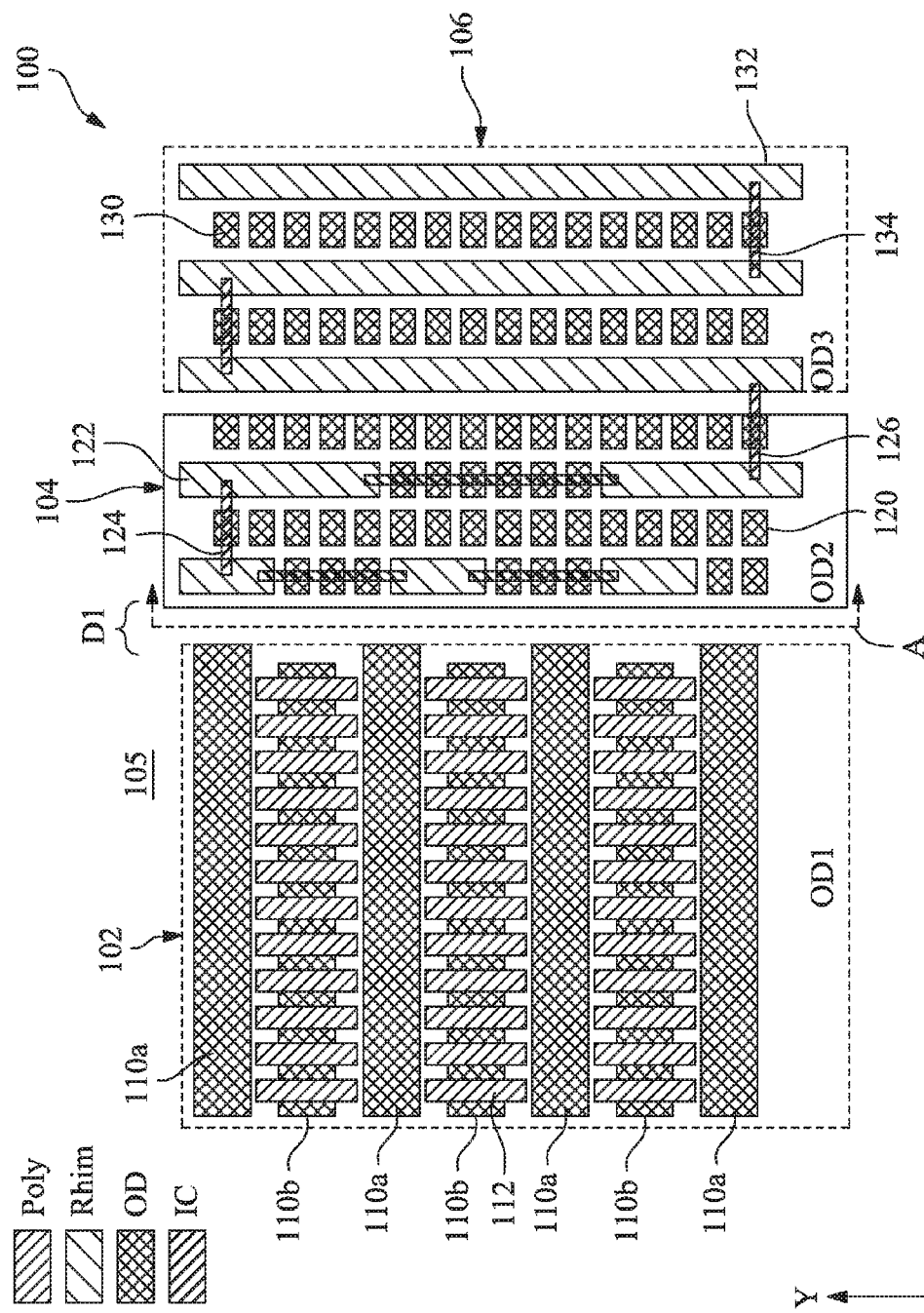
FIG. 1A is top view of a portion of a layout diagram of a semiconductor device in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device includes a first semiconductor structure, a second semiconductor structure and a third semiconductor structure. The first semiconductor structure has a first oxide diffusion (OD) pattern density. The second semiconductor structure has a second OD pattern density. The third semiconductor structure has a third OD pattern density. The second semiconductor structure is between the first semiconductor structure and the third semiconductor structure. The first semiconductor structure, the second semiconductor structure and the third semiconductor structure do not overlap each other.

FIG. 1A is a top view of a portion of a layout diagram of a semiconductor device 100 in accordance with one or more embodiments.

A person having ordinary skill in the art would appreciate that one or more of the layout patterns described herein is usable to prepare a set of masks, that are in turn usable for manufacturing the semiconductor device 100.

The semiconductor device 100 includes a first semiconductor layout pattern 102, a second semiconductor layout pattern 104, a third semiconductor layout pattern 106 and an isolation region 105. Isolation region 105 surrounds first semiconductor layout pattern 102, second semiconductor layout pattern 104 and third semiconductor layout pattern 106. Isolation region 105 provides electrical isolation between devices in first semiconductor layout pattern 102 and devices in second semiconductor layout pattern 104 and third semiconductor layout pattern 106.

First semiconductor layout pattern 102 is associated with a first semiconductor structure of semiconductor device 100. Second semiconductor layout pattern 104 is associated with a second semiconductor structure of semiconductor device 100. First semiconductor layout pattern 102 is separated from second semiconductor layout pattern 104 by isolation region 105 and by a distance D1 in a direction X. In some embodiments, distance D1 is less than 100 micrometers (µm). If distance D1 is too great, a size of semiconductor device 100 is increased without an increase in functionality, in some instances. If distance D1 is too small, performance of at least one of the first semiconductor structure or the second semiconductor structure is negatively impacted by parasitic capacitance or resistance resulting from operation of the first semiconductor structure and the second semiconductor structure, in some instances. Third semiconductor layout pattern 106 is associated with a third semiconductor structure of the semiconductor device 100. In some embodiments, the second semiconductor structure is electrically connected to the third semiconductor structure. An isolation region 105 is outside at least first semiconductor layout pattern 102, second semiconductor layout pattern 104 and the third semiconductor layout pattern 106. In some embodiments, first semiconductor layout pattern 102, second semiconductor layout pattern 104 and third semiconductor layout pattern 106 and isolation region 105 are non-overlapping in space. Second semiconductor layout pattern 104 is between first semiconductor layout pattern 102 and third semiconductor layout pattern 106. In some embodiments, second semiconductor layout pattern 104 is adjacent to at least one of first semiconductor layout pattern 102 or third semiconductor layout pattern 106.

First semiconductor layout pattern 102 is usable to form at least a portion of a first circuit element. In some embodiments, the first circuit element includes at least one active element or passive element. Examples of active elements include, but are not limited to, transistors and diodes. Examples of diodes include, but are not limited to, varactors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drains. Examples of passive elements include, but are not limited to, capacitors, inductors, fuses, and resistors. Examples of capacitors include, but are not limited to, MOS capacitors (MOSCAPs).

First semiconductor layout pattern 102 includes one or more OD layout patterns 110a, 110b. Each of the one or more OD layout patterns 110a, 110b is associated with forming a corresponding OD structure. In some embodiments, the one or more OD layout patterns 110a, 110b are referred to as active regions of a substrate. In some embodiments, the OD layout patterns 110a and 110b are referred to as doped regions of a substrate. In some embodiments, each of the one or more OD layout patterns 110a, 110b independently define a P-type transistor area or an N-type transistor area. In some embodiments, one or more OD layout patterns 110a, 110b correspond to a source or a drain of a transistor. The one or more OD layout patterns 110b are located between the one or more OD layout patterns 110a. In some embodiments, the one or more OD layout patterns 110a, 110b include any shape.

First semiconductor layout pattern 102 also includes one or more conductive layout patterns 112. Each of the one or more conductive layout patterns 112 is associated with a corresponding conductive structure. In some embodiments, one or more conductive layout patterns 112 correspond to a gate of a transistor. The one or more conductive layout patterns 112 are configured to overlap one or more OD layout patterns 110b. The one or more conductive layout patterns 112 are located between the one or more OD layout patterns 110a. In some embodiments, the one or more conductive layout patterns 112 include any shape. In some embodiments, a material of one or more conductive layout patterns 112 includes polysilicon, metal, conductive polymers, or another suitable conductive material.

First semiconductor layout pattern 102 has an OD pattern density OD1. Each OD layout pattern 110a and 110b includes multiple individual OD regions. An OD pattern density is a density of the collectively OD region(s) occupying a section of semiconductor device 100. The OD pattern density is a ratio of the area occupied by the OD regions in a particular section with respect to the total area of that particular section. The OD pattern density of a given section is represented by Formula 1:

OD Pattern Density=Total Area of OD regions in section/Total Section Area (1)

where the OD Pattern Density is the density of OD regions in a given section, Total Area of OD in section is the total area of the OD regions in the given section, and Total Section Area is the total area of the entire section.

In some embodiments, the OD pattern density OD1 for first semiconductor layout pattern 102 is greater than 70%. In some embodiments, the OD pattern density OD1 for first semiconductor layout pattern 102 ranges from about 50% to about 80%. If OD pattern density OD1 is too high, then individual elements, e.g., elements formed by conductive layout patterns 112, within first semiconductor layout pattern 102 are electrically shorted together because a distance between adjacent OD patterns 110a and 110b is too small, in some instances. If OD pattern density OD1 is too low, then internal resistance within individual elements of first semiconductor layout pattern 102 is increased and the individual elements do not function as desired, in some instances.

Second semiconductor layout pattern 104 is usable to form at least a portion of a second circuit element. In some embodiments, the second circuit element includes one or more resistors.

Second semiconductor layout pattern 104 includes one or more OD layout patterns 120. The one or more OD layout patterns 120 correspond to an active area. Each of the one or more OD layout patterns 120 is associated with a corresponding OD structure. In some embodiments, each of the one or more OD layout patterns 120 independently defines a location for a P-type transistor area or an N-type transistor area. In some embodiments, the one or more OD layout patterns 120 include any shape.

Second semiconductor layout pattern 104 has an OD pattern density OD2. In some embodiments, the OD pattern density OD2 for the second semiconductor layout pattern 104 ranges from about 30% to about 70%. If OD pattern density OD2 is too high, a gradient between an OD pattern density in third semiconductor layout pattern 106 and OD pattern density OD2 is too high and manufacturing yield decreases, in some instances. If OD pattern density OD2 is too low, a gradient between OD pattern density OD1 and OD pattern density OD2 is too high and manufacturing yield decreases, in some instances. In some embodiments, the OD pattern density OD2 for the second semiconductor layout pattern 104 is less than the OD pattern density OD1 for the first semiconductor layout pattern 102. In some embodiments, a difference between the OD pattern density OD2 for the second semiconductor layout pattern 104 and the OD pattern density OD1 for the first semiconductor layout pattern 102 is less than a first threshold. The first threshold specifies an OD pattern density gradient value for a semiconductor device layout which is able to be manufactured with an acceptable yield. In some embodiments, a difference between the OD pattern density OD2 and the OD pattern density OD1 is substantially equal to the first threshold. In some embodiments, the first threshold ranges from about 25% to about 35%. In some embodiments, the first threshold is substantially equal to about 30%. In some embodiments, the first threshold is determined based on simulation results. In some embodiments, the first threshold value is determined based on statistical analysis of empirical evidence. If the first threshold value is too high, then manufacturing yield decreases in some instances. If the first threshold value is too low, then an internal resistance of devices in second semiconductor layout pattern 104 is decreased and the devices do not function as resistors, in some instances.

Second semiconductor layout pattern 104 also includes one or more resistor layout patterns 122. The one or more resistor layout patterns 122 are associated with one or more corresponding resistor structures of the semiconductor device 100. In some embodiments, the one or more resistor structures, defined by the one or more resistor layout patterns 122, include polysilicon or a conductive material. In some embodiments, the one or more resistor layout patterns 122 include any shape. The one or more resistor layout patterns 122 are located between the one or more OD layout patterns 120. The one or more resistor structures defined by the one or more resistor layout patterns 122 do not overlap with the one or more OD structures formed by the one or more OD layout patterns 120. In some embodiments, the one or more resistor structures formed by the one or more resistor layout patterns 122 are located on a different layer of semiconductor device 100 from the one or more OD structures formed by the one or more OD layout patterns 120. A layer of semiconductor device 100 is determined based on a distance from a top surface of a substrate of the semiconductor device.

Second semiconductor layout pattern 104 also includes one or more interconnect layout patterns 124. The one or more interconnect layout patterns 124 are associated with one or more corresponding interconnect structures of the semiconductor device 100. In some embodiments, the one or more interconnect structures (formed by the one or more interconnect layout patterns 124) include a conductive material. In some embodiments, the one or more interconnect structures are configured to connect the one or more resistor structures (formed by the one or more resistor layout patterns 122) to each other in series. In some embodiments, the one or more interconnect layout patterns 124 include any shape. The one or more interconnect layout patterns 124 are located between the one or more resistor layout patterns 122. In some embodiments, the one or more interconnect structures formed by the one or more interconnect layout patterns 124 are configured to overlap the one or more OD structures formed by the one or more OD layout patterns 120. In some embodiments, the one or more interconnect structures formed by the one or more interconnect layout patterns 124 are located on a different layer of semiconductor device 100 from the one or more OD structures or the one or more resistor structures.

Second semiconductor layout pattern 104 also includes an interconnect layout pattern 126. Interconnect layout pattern 126 is associated with a corresponding interconnect structure of the semiconductor device 100. In some embodiments, the interconnect structure (formed by interconnect layout pattern 126) includes a conductive material. In some embodiments, the interconnect structure (formed by interconnect layout pattern 126) is configured to connect the one or more resistor structures (formed by the one or more resistor layout patterns 122) to third semiconductor structure 106 (by one or more resistor structures formed by a one or more resistor layout patterns 132) in series. In some embodiments, interconnect layout pattern 126 includes any shape. Interconnect layout pattern 126 is configured to overlap a part of second semiconductor layout pattern 104 and a part of third semiconductor layout pattern 106. In some embodiments, the interconnect structure formed by interconnect layout pattern 126 is configured to overlap the one or more OD structures formed by the one or more OD layout patterns 120. In some embodiments, the interconnect structure formed by interconnect layout pattern 126 is located on a different layer of semiconductor device 100 from the one or more OD structures or the one or more resistor structures in second semiconductor layout pattern 104.

Second semiconductor layout pattern 104 has an equivalent resistance. The equivalent resistance of second semiconductor layout pattern 104 is based on an equivalent resistance for at least one or more of the elements within the second semiconductor layout pattern 104 (e.g., the one or more OD layout patterns 120, the one or more resistor layout patterns 122, the one or more interconnect layout patterns 124 or interconnect layout pattern 126). In some embodiments, second semiconductor layout pattern 104 is used to form an incremental resistor. As OD pattern density OD2 in second semiconductor layout pattern 104 increases, resistance within second semiconductor layout pattern 104 decreases.

Third semiconductor layout pattern 106 is usable to form at least a portion of a second circuit element. In some embodiments, third semiconductor layout pattern 106 is usable to form at least the third circuit element. In some embodiments, the third circuit element includes one or more resistors.

Third semiconductor layout pattern 106 includes one or more OD layout patterns 130. OD layout patterns 130 are similar to OD layout patterns 120. In some embodiments, at least one of a size, shape, dopant type or dopant concentration of OD layout patterns 130 are different from OD layout patterns 120.

Third semiconductor layout pattern 106 has an OD pattern density OD3. In some embodiments, the OD pattern density OD3 for the third semiconductor layout pattern 106 is less than about 30%. The OD pattern density OD3 is less than the OD pattern density OD2. If OD pattern density OD3 is too low, a gradient between OD pattern density OD3 and OD pattern density OD2 is too high and manufacturing yield decreases, in some instances. If OD pattern density OD3 is too high, resistance within third semiconductor layout pattern 106 is decreased and third semiconductor layout pattern 106 does not facilitate formation of a resistor, in some instances. In some embodiments, a difference between the OD pattern density OD3 and the OD pattern density OD2 is less than the first threshold. In some embodiments, a difference between the OD pattern density OD3 and the OD pattern density OD2 is substantially equal to the first threshold. In some embodiments, the difference between the OD pattern density OD3 and the OD pattern density OD2 ranges from about 25% to about 35%. If the difference in OD pattern density OD3 and OD pattern density OD2 is too high, then manufacturing yield decreases in some instances. If the difference in OD pattern density OD3 and OD pattern density OD2 is too low, then an internal resistance of devices in third semiconductor layout pattern 106 is decreased and the devices in third semiconductor layout pattern 106 do not function as resistors, in some instances.

Third semiconductor layout pattern 106 also includes one or more resistor layout patterns 132. The one or more resistor layout patterns 132 are associated with one or more corresponding resistor structures of the semiconductor device 100. In some embodiments, the one or more resistor structures, formed by the one or more resistor layout patterns 132, include polysilicon or a conductive material. In some embodiments, the one or more resistor layout patterns 132 include any shape. The one or more resistor layout patterns 132 are located between the one or more OD layout patterns 130. The one or more resistor structures formed by the one or more resistor layout patterns 132 do not overlap with the one or more OD structures formed by the one or more OD layout patterns 130. In some embodiments, the one or more resistor structures formed by the one or more resistor layout patterns 132 are located on a different layer of semiconductor device 100 from the one or more OD structures formed by the one or more OD layout patterns 130.

Third semiconductor layout pattern 106 also includes one or more interconnect layout patterns 134. The one or more interconnect layout patterns 134 are associated with one or more corresponding interconnect structures of the semiconductor device 100. In some embodiments, the one or more interconnect structures (formed by the one or more interconnect layout patterns 134) include a conductive material. In some embodiments, the one or more interconnect structures are configured to connect the one or more resistor structures to each other in a series configuration. In some embodiments, the one or more interconnect layout patterns 134 include any shape. The one or more interconnect layout patterns 134 are located between the one or more resistor layout patterns 132. In some embodiments, the one or more interconnect structures formed by the one or more interconnect layout patterns 134 are configured to overlap with the one or more OD structures formed by the one or more OD layout patterns 130. In some embodiments, the one or more interconnect structures formed by the one or more interconnect layout patterns 134 are located on a different layer of semiconductor device 100 from the one or more OD structures formed by the one or more OD layout patterns 130 or the one or more resistor structures formed by the one or more resistor layout patterns 132.

Third semiconductor layout pattern 106 has an equivalent resistance. The equivalent resistance of third semiconductor layout pattern 106 is based on an equivalent resistance for at least one or more of the elements within the third semiconductor layout pattern 106 (e.g., the one or more OD layout patterns 130, the one or more resistor layout patterns 132 or the one or more interconnect layout patterns 134). In some embodiments, the equivalent resistance of third semiconductor layout pattern 106 is greater than the equivalent resistance of second semiconductor layout pattern 104.

In some embodiments, OD pattern density OD1, OD2 or OD3 is determined by an electronic design automation (EDA) tool.

In view of the layout diagram depicted in FIG. 1, the resulting semiconductor device 100 manufactured based on the layout patterns of FIG. 1 has a first semiconductor structure (based on first semiconductor layout pattern 102), a second semiconductor structure (based on second semiconductor layout pattern 104), a third semiconductor structure (based on third semiconductor layout pattern 106) and an isolation structure 105 surrounding the first, second and third semiconductor structures. The first semiconductor structure has one or more OD structures (based on one or more OD layout patterns 110a, 110b) and one or more polysilicon structures (based on one or more polysilicon layout patterns 112). The first semiconductor structure is separated from the second semiconductor structure by a distance D1 in the direction X.

The second semiconductor structure has one or more OD structures (based on one or more OD layout patterns 120), one or more resistor structures (based on one or more resistor layout patterns 122), one or more interconnect structures (based on one or more interconnect layout patterns 124) and interconnect structure (based on interconnect layout pattern 126). The one or more interconnect structures (based on one or more interconnect layout patterns 124) are configured to connect the one or more resistor structures (based on one or more resistor layout patterns 122) to each other. The interconnect structure (based on interconnect layout pattern 126) is configured to connect the one or more resistor structures (based on one or more resistor layout patterns 122) of the second semiconductor structure to the one or more resistor structures (based on one or more resistor layout patterns 132) of the third semiconductor structure.

The third semiconductor structure has one or more OD structures (based on one or more OD layout patterns 130), one or more resistor structures (based on one or more resistor layout patterns 132) and one or more interconnect structures (based on one or more interconnect layout patterns 134). The one or more interconnect structures (based on one or more interconnect layout patterns 132) are configured to connect the one or more resistor structures (based on one or more resistor layout patterns 134) to each other.

In comparison with other approaches, semiconductor device 100 includes second semiconductor layout pattern 104 which has an incremental OD density, OD2. Inclusion of an incremental OD density helps to increase manufacturing yield in comparison with other approaches which do not include the incremental OD density. In some instances, a large difference in OD density in neighboring regions of a semiconductor device reduces manufacturing yield. Effects of the reduced manufacturing yield are more prominent in smaller technology nodes, such as nodes less than about 28 nanometers (nm). Including the incremental OD density helps with the inclusion of a high resistance resistor in smaller technology nodes while maintaining acceptable manufacturing yield.

Figure 1B:
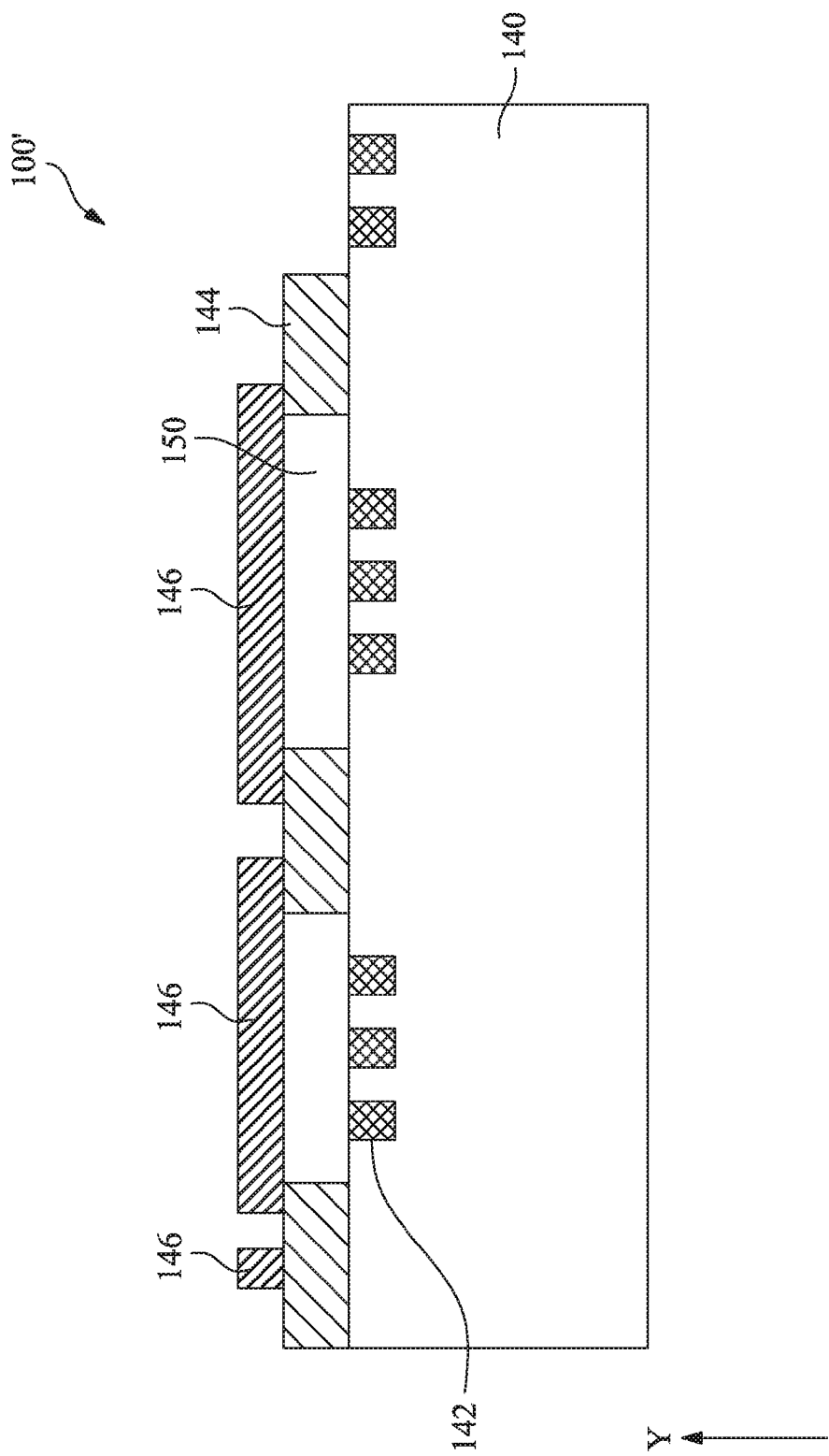
FIG. 1B is a cross-sectional view of a semiconductor structure manufactured according to the layout depicted in FIG. 1A and taken along reference line A in accordance with one or more embodiments.

The physical structure of a portion of the resulting semiconductor device 100 is further illustrated by FIG. 1B.

FIG. 1B is a cross-sectional view of a semiconductor structure 100' manufactured according to the layout 100 depicted in FIG. 1A and taken along reference line A in accordance with one or more embodiments. Semiconductor structure 100' is a non-limiting example for facilitating the illustration of the present disclosure.

Semiconductor structure 100' includes a substrate 140, one or more OD structures 142 in the substrate 140, one or more resistor structures 144 over the substrate, one or more interconnect structures 146 connecting the one or more resistor structures 144 to each other and an insulating layer 150. The insulating layer 150 electrically isolates the one or more interconnect structures 146 from the one or more OD structures 142.

In some embodiments, substrate 140 comprises an elementary semiconductor, a compound semiconductor, an alloy semiconductor, or combinations thereof. Examples of the elementary semiconductor include, but are not limited to, silicon and germanium. Examples of a compound semiconductor include, but are not limited to, silicon carbide, gallium arsenic, gallium phosphide, indium phosphide, indium arsenide, and indium antimonide. Examples of the alloy semiconductor include, but are not limited to, SiGe, GaAsP, AlInAs, AlGaAs, GaInAs, GaInP, and GaInAsP. Other semiconductor materials including group III, group IV, and group V elements are used in some embodiments. In one or more embodiments, substrate 140 comprises a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type. In some embodiments, substrate 140 comprises a P-type doped substrate. Examples of P-type dopants in the P-doped substrate include, but are not limited to, boron, gallium, and indium.

In some embodiments, one or more masks with various layout patterns are also used in conjunction with one or more masks having OD layout pattern 120 to fabricate OD structure 142. In some embodiments, insulating layer 150 includes materials suitable to electrically insulate the one or more OD structures 142 from other portions of the semiconductor structure 100'.

In some embodiments, each of the one or more resistor structures includes a polysilicon material or a conductive material. In some embodiments, the conductive material includes copper, aluminum, nickel, titanium, tungsten or another suitable conductive material. In some embodiments, one or more additional masks with various layout patterns are also used in conjunction with one or more masks having resistor layout pattern 122 to fabricate resistor structure 144. In some embodiments, insulating layer 150 includes materials suitable to electrically insulate the one or more resistor structures 144 from other portions of the semiconductor structure 100'.

In some embodiments, the one or more interconnect structures 146 are directly connected to the one or more resistor structures 144. In some embodiments, the one or more interconnect structures 146 are connected to the one or more resistor structures 144 by a via (not shown). In some embodiments, the one or more interconnect structures 146 are connected to the one or more resistor structures 144 in a series configuration. In some embodiments, each of the one or more interconnect structures 146 includes a conductive material. In some embodiments, the conductive material includes copper, aluminum, nickel, titanium, tungsten or another suitable conductive material. In some embodiments, one or more additional masks with various layout patterns are also used in conjunction with one or more masks having interconnect layout pattern 124 to fabricate interconnect structure 146. In some embodiments, insulating layer 150 includes materials suitable to electrically insulate the one or more interconnect structures 146 from other portions of the semiconductor structure 100'.

Figure 2:
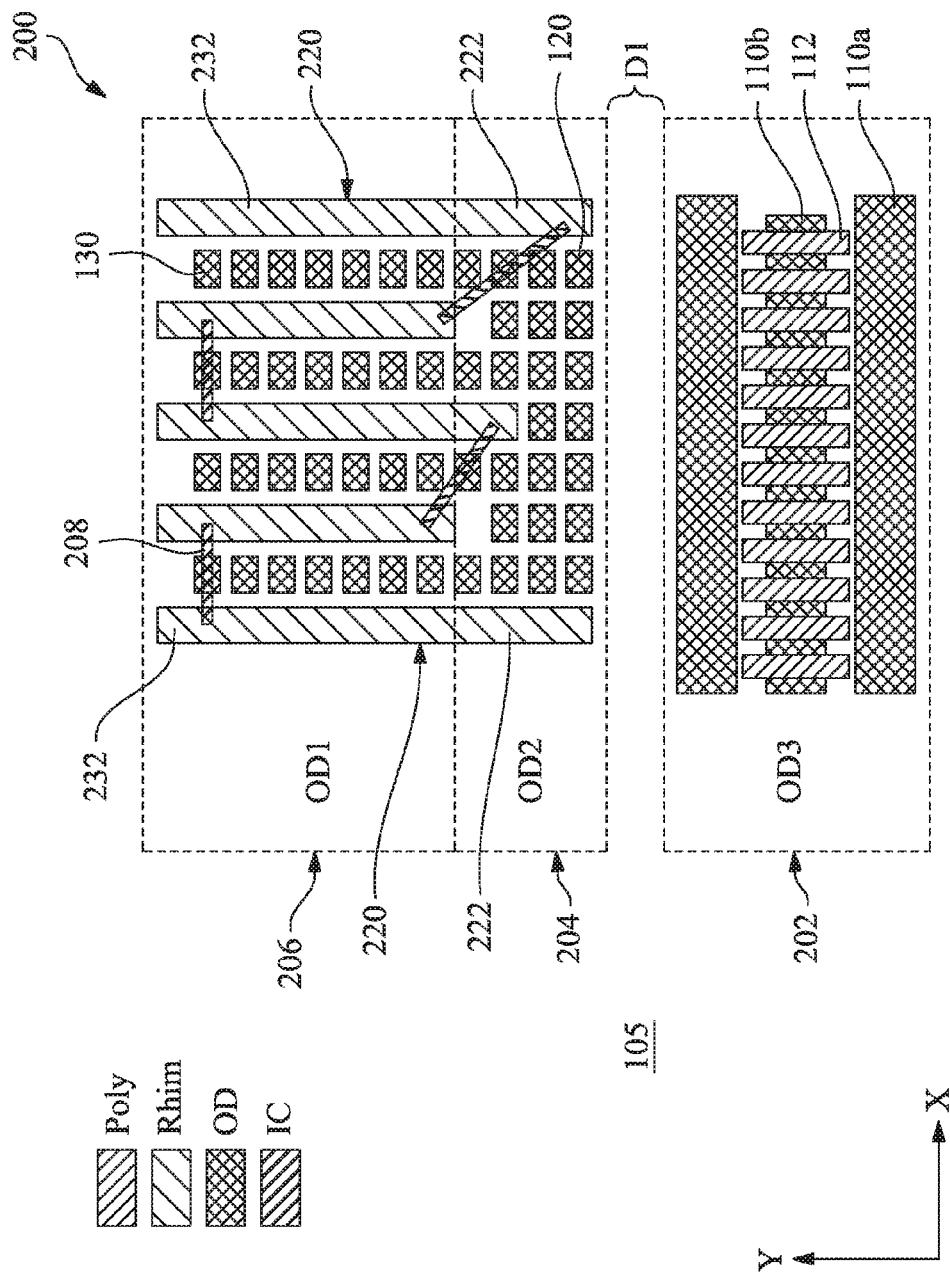
FIG. 2 is a top view of a portion of a layout diagram of a semiconductor device in accordance with one or more embodiments.

FIG. 2 is a top view of a portion of a layout diagram of a semiconductor device 200 in accordance with one or more embodiments. Semiconductor device 200 is similar to semiconductor device 100 in FIG. 1A. Components in FIG. 2 that are the same or similar to those in FIG. 1A are given the same reference numbers.

In some embodiments, first semiconductor layout pattern 202 is similar to first semiconductor layout pattern 102 in FIG. 1A. In some embodiments, second semiconductor layout pattern 204 is similar to second semiconductor layout pattern 104. In some embodiments, third semiconductor layout pattern 206 is similar to third semiconductor layout pattern 106. In comparison with second semiconductor layout pattern 104, second semiconductor layout pattern 204 is included as part of third semiconductor layout pattern 206. In some embodiments, second semiconductor layout pattern 204 is a portion of third semiconductor layout pattern 206 closest to first semiconductor layout pattern 202. In comparison with first semiconductor layout pattern 102, first semiconductor layout pattern 202 is separated from second semiconductor layout pattern 204 by distance D1 in a direction Y. In comparison with semiconductor device 100, second semiconductor layout pattern 204 and third semiconductor layout pattern 206 are positioned above the first semiconductor layout pattern 202 in the direction Y.

In some embodiments, interconnect layout pattern 208 is similar to one or more interconnect layout patterns 124, 126 or 134 in FIG. 1A. In some embodiments, the interconnect layout structures (formed by the interconnect layout patterns 208) are configured to connect the one or more resistor structures (formed by the one or more resistor layout patterns 220) to each other in series.

In some embodiments, resistor layout pattern 220 is similar to one or more resistor layout patterns 122 or 132 in FIG. 1A. In comparison with semiconductor device 100, resistor layout pattern 220 is a continuous feature which extends in the direction Y.

Resistor layout pattern 220 includes a first resistor layout pattern 222 and a second resistor layout pattern 232. In some embodiments, a portion of first resistor layout pattern 222 of resistor layout pattern 220 located closest to first semiconductor layout pattern 202 is in second semiconductor layout pattern 204. In some embodiments, a portion of second resistor layout pattern 232 of resistor layout pattern 220 located farther from first semiconductor layout pattern 202 is in third semiconductor layout pattern 206.

Figure 3:
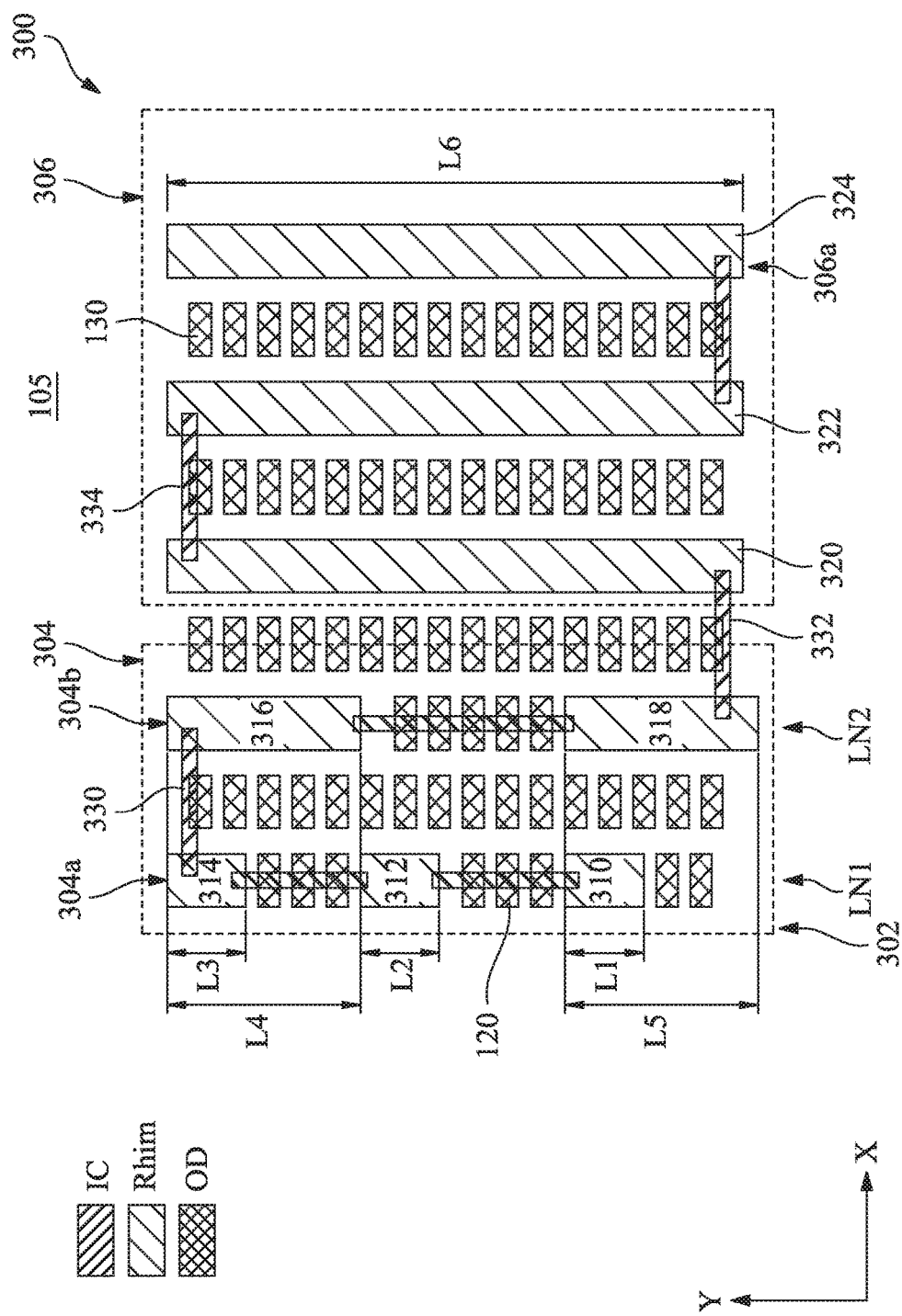
FIG. 3 is a top view of a portion of a layout diagram of a semiconductor device in accordance with one or more embodiments.

FIG. 3 is a top view of a portion of a layout diagram of a semiconductor device 300 in accordance with one or more embodiments. Semiconductor device 300 is similar to second semiconductor pattern layout 104 and third semiconductor pattern layout 106 in FIG. 1A. Components in FIG. 3 that are the same or similar to those in FIG. 1A are given the same reference numbers.

The layout of the semiconductor device 300 includes a second semiconductor layout pattern 304, a third semiconductor layout pattern 306 and an isolation region 105. In some embodiments, second semiconductor layout pattern 304 is similar to second semiconductor layout pattern 104 in FIG. 1A. In some embodiments, third semiconductor layout pattern 306 is similar to third semiconductor layout pattern 106.

Second semiconductor layout pattern 304 includes one or more OD layout patterns 120, a resistor layout pattern 304a, a resistor layout pattern 304b, one or more interconnect layout patterns 330 and interconnect layout patterns 332. Second semiconductor layout pattern 304 also includes an edge portion 302. In some embodiments, edge portion 302 is directly next to a first semiconductor layout pattern 102 (FIG. 1A).

In some embodiments, resistor layout pattern 304a is similar to one or more resistor layout patterns 122 in FIG. 1A. In some embodiments, resistor layout pattern 304b is similar to one or more resistor layout patterns 122. In some embodiments, one or more interconnect layout patterns 330 is similar to one or more interconnect layout patterns 122. In some embodiments, interconnect layout pattern 332 is similar to interconnect layout pattern 126.

Resistor layout pattern 304a is associated with a corresponding first portion of a resistor structure of the semiconductor device 300. Resistor layout pattern 304a includes a first resistor layout pattern 310, a second resistor layout pattern 312 and a third resistor layout pattern 314. Resistor layout pattern 304a (e.g., first resistor layout pattern 310, second resistor layout pattern 312 and third resistor layout pattern 314) is arranged in a first line LN1 extending in a first direction, e.g., direction Y.

First resistor layout pattern 310 is associated with a corresponding first resistor structure of the semiconductor device 300. Second resistor layout pattern 312 is associated with a corresponding second resistor structure of the semiconductor device 300. Third resistor layout pattern 314 is associated with a corresponding third resistor structure of the semiconductor device 300.

First resistor layout pattern 310 has a length L1 extending in the direction Y. Second resistor layout pattern 312 has a length L2 extending in the direction Y. Third resistor layout pattern 314 has a length L3 extending in the direction Y. In some embodiments, one or more of length L1, length L2 or length L3 are substantially the same. In some embodiments, length L1 is different from at least one of length L2 or length L3.

Resistor layout pattern 304*b* is associated with a corresponding second portion of a resistor structure of the semiconductor device 300. Resistor layout pattern 304*b* includes a fourth layout pattern 316 and a fifth resistor layout pattern 318. Resistor layout pattern 304*b* (e.g., fourth resistor layout pattern 316 and fifth resistor layout pattern 318) is arranged in a second line LN2 extending in the first direction. First line LN1 is substantially parallel to second line LN2.

Fourth resistor layout pattern 316 is associated with a corresponding fourth resistor structure of the semiconductor device 300. Fifth layout pattern 318 is associated with a corresponding fifth resistor structure of semiconductor device 300.

Fourth resistor layout pattern 316 has a length L4 extending in the direction Y. Fifth resistor layout pattern 318 has a length L5 extending in the direction Y. In some embodiments, length L4 and length L5 are substantially the same. In some embodiments, length L4 and length L5 are different. In some embodiments, one or more of length L4 or length L5 is greater than one or more of length L1, length L2 or length L3. In some embodiments, one or more of length L4 or length L5 are less than or equal to one or more of length L1, length L2 or length L3.

Each of first resistor layout pattern 310, second resistor layout pattern 312, third resistor layout pattern 314, fourth layout pattern 316 and fifth resistor layout pattern 318 are connected by one or more interconnect layout patterns 330. In some embodiments, the first, second, third, fourth and fifth resistor structures of semiconductor device 300 are connected in series by one or more interconnect structures of semiconductor device 300. Fifth resistor layout pattern 318 is connected to third semiconductor layout pattern 306 by interconnect layout pattern 332. In some embodiments, at least one of first resistor layout pattern 310, second resistor layout pattern 312, third resistor layout pattern 314, or fourth resistor layout pattern 316 is connected to third semiconductor layout pattern 306 by an interconnect layout pattern, e.g., interconnect layout pattern 332.

Third semiconductor layout pattern 306 includes one or more OD layout patterns 130, a resistor layout pattern 306*a* and one or more interconnect layout patterns 334. In some embodiments, resistor layout pattern 306*a* is similar to one or more resistor layout patterns 132 in FIG. 1A. In some embodiments, one or more interconnect layout patterns 334 is similar to one or more interconnect layout patterns 134.

Resistor layout pattern 306*a* is associated with a corresponding third portion of a resistor structure of the semiconductor device 300. Resistor layout pattern 306*a* includes a sixth resistor layout pattern 320, a seventh resistor layout pattern 322 and an eighth resistor layout pattern 324.

Sixth resistor layout pattern 320 is associated with a corresponding sixth resistor structure of the semiconductor device 300. Seventh resistor layout pattern 322 is associated with a corresponding seventh resistor structure of the semiconductor device 300. Eighth resistor layout pattern 324 is associated with forming a corresponding eighth resistor structure of the semiconductor device 300.

One or more of sixth resistor layout pattern 320, seventh resistor layout pattern 322 or eighth resistor layout pattern 324 has a length L6 extending in the direction Y. In some embodiments, length L6 is greater than one or more of length L1 o, length L2, length L3, length L4 or length L5. In some embodiments, length L6 is less than or equal to one or more of length L1, length L2, length L3, length L4 or length L5.

Each of sixth resistor layout pattern 320, seventh resistor layout pattern 322 and eighth resistor layout pattern 324 are connected by one or more interconnect layout patterns 334. In some embodiments, the sixth, seventh and eighth resistor structures of semiconductor device 300 are connected in series by one or more interconnect structures of semiconductor device 300. Fifth resistor layout pattern 318 is connected to sixth resistor layout pattern 320 by interconnect layout pattern 332. Sixth resistor layout pattern 320 is connected to seventh resistor layout pattern 322 by interconnect layout pattern 332. In some embodiments, at least one fifth resistor layout pattern 318, sixth resistor layout pattern 320 or seventh resistor layout pattern 322 is connected to second semiconductor pattern layout 304.

Figure 4:
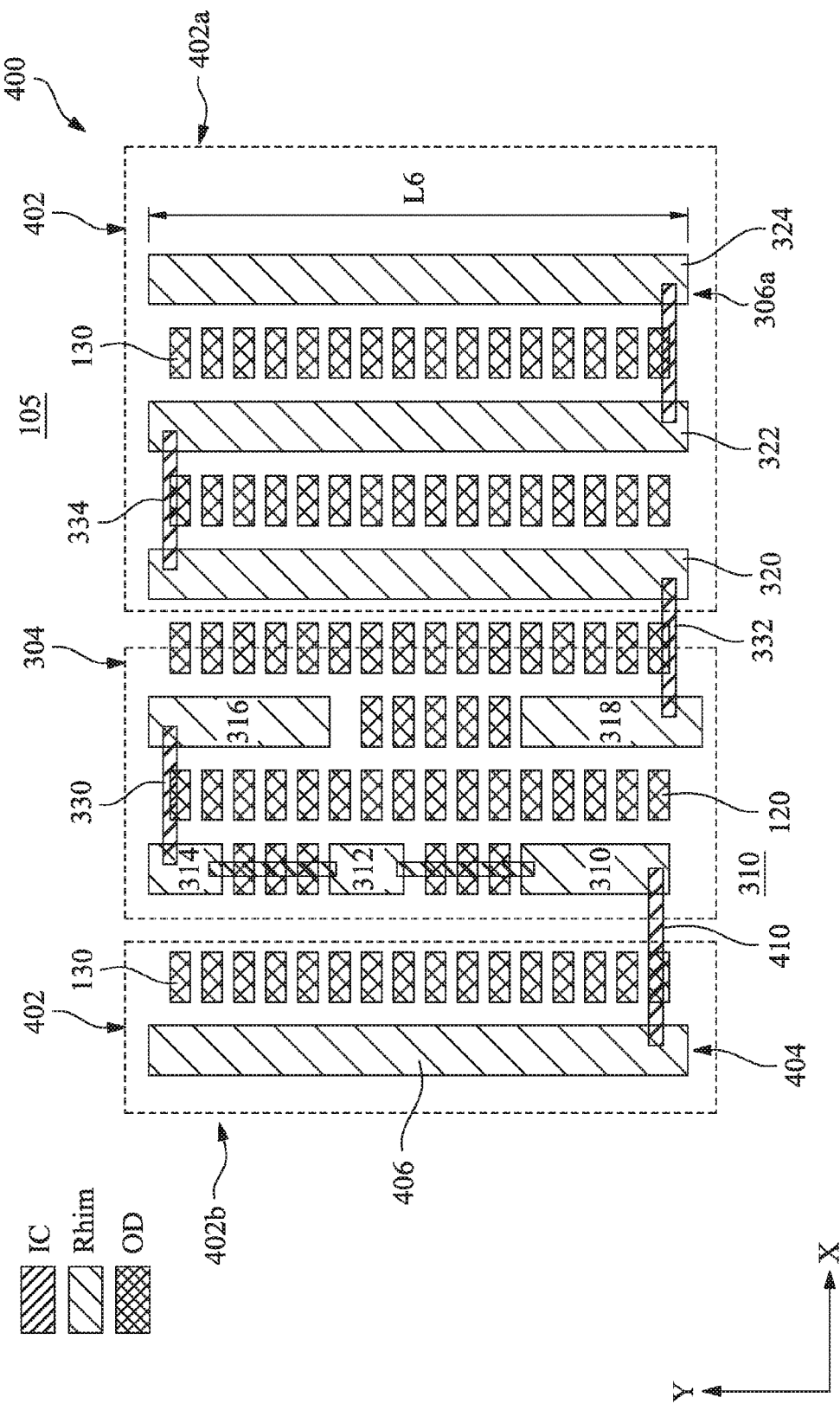
FIG. 4 is a top view of a portion of a layout diagram of a semiconductor device in accordance with one or more embodiments.

FIG. 4 is a top view of a portion of a layout diagram of a semiconductor device 400 in accordance with one or more embodiments. In some embodiments, semiconductor device 400 is similar to second semiconductor layout pattern 104 and third semiconductor layout pattern 106 in FIG. 1A. Components in FIG. 4 that are the same or similar to those in FIG. 1A are given the same reference numbers. In some embodiments, semiconductor device 400 is similar to semiconductor device 300 in FIG. 3. Components in FIG. 4 that are the same or similar to those in FIG. 3 are given the same reference numbers.

The layout of the semiconductor device 400 includes a second semiconductor layout pattern 304, a third semiconductor layout pattern 402 and an isolation region 105.

Third semiconductor layout pattern 402 includes a first portion layout pattern 402*a*, a second portion layout pattern 402*b* and an interconnect layout pattern 410.

In comparison with semiconductor device 300, semiconductor device 400 includes second semiconductor layout pattern 304 between first portion layout pattern 402*a* and second portion layout pattern 402*b*.

In some embodiments, second semiconductor layout pattern 304 is adjacent to second portion layout pattern 402*b*. In some embodiments, second portion layout pattern 402*b* is adjacent to first semiconductor layout pattern 102 (FIG. 1A).

Second portion layout pattern 402*b* includes one or more OD layout patterns 130, a resistor layout pattern 404 and interconnect layout pattern 410. In some embodiments, resistor layout pattern 404 is similar to resistor layout pattern 306*a* in FIG. 3.

Resistor layout pattern 404 is associated with a corresponding resistor portion of the third semiconductor structure of the semiconductor device 400. Resistor layout pattern 404 includes a ninth resistor layout pattern 406.

Ninth resistor layout pattern 406 is associated with a corresponding ninth resistor structure of the semiconductor device 400. In some embodiments, ninth resistor layout pattern 406 is similar to sixth resistor layout pattern 320, seventh resistor layout pattern 322 or eighth resistor layout pattern 324.

Ninth resistor layout pattern 406 is connected to first resistor layout pattern 310 by interconnect layout pattern 410. In some embodiments, the ninth resistor structure of semiconductor device 400 (formed by ninth resistor layout pattern 410) is connected in series with the first, second, third, fourth, fifth, sixth, seventh and eighth resistor structures of semiconductor device 400 by one or more interconnect structures of semiconductor device 400.

Figure 5A:
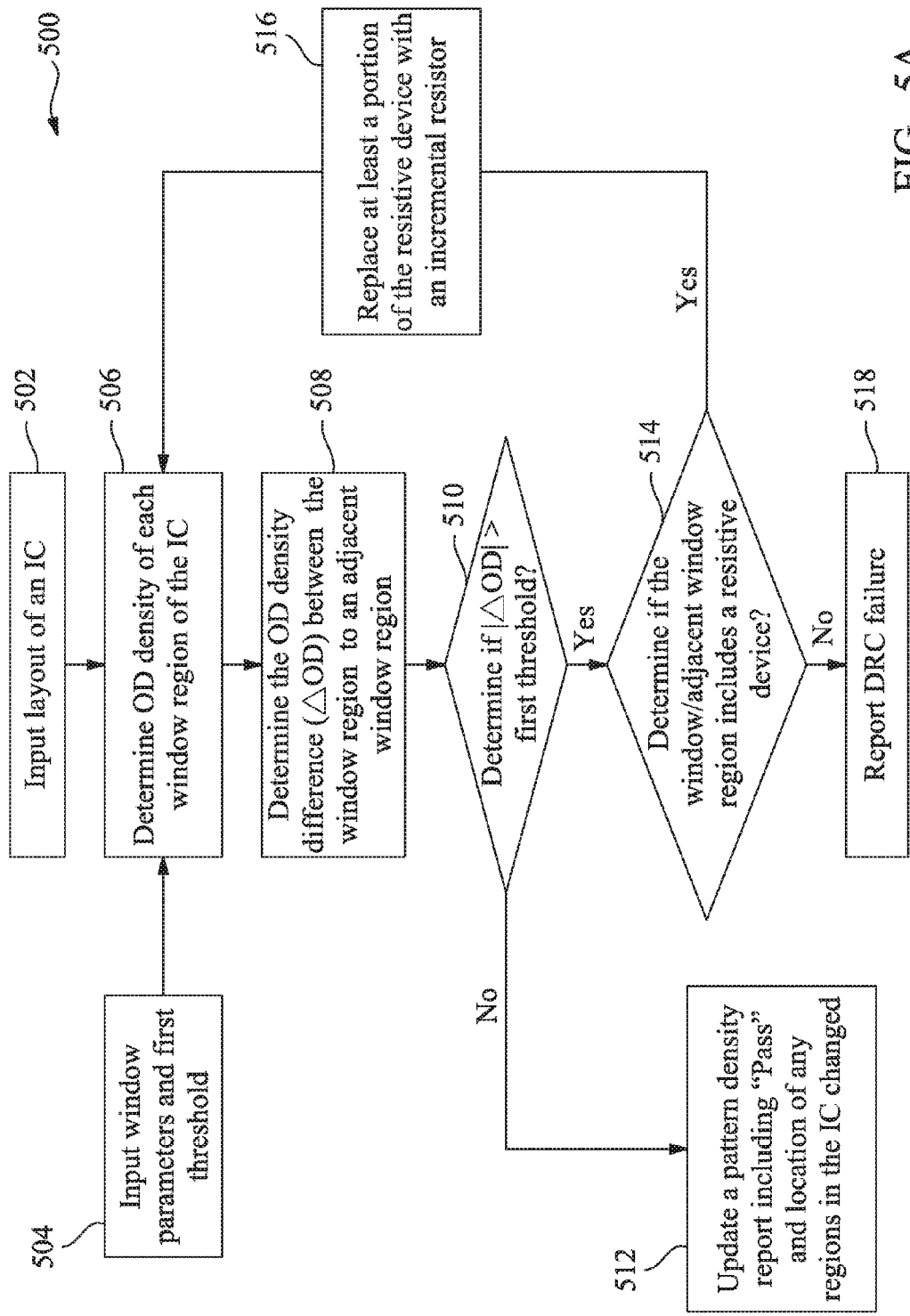
FIG. 5A is a flowchart of a method of manufacturing a semiconductor device in accordance with one or more embodiments.

FIG. 5A is a flowchart of a method 500 of manufacturing a semiconductor device in accordance with one or more embodiments. In some embodiments, method 500 is utilized to modify a layout design for a semiconductor device. It is understood that in some embodiments additional operations are performed before, during, and/or after the method 500 depicted in FIG. 5A, and that some other processes may only be briefly described herein. In some embodiments, the method 500 is implemented using a computer program code executable by a processor. In some embodiments, method 500 is implemented using an EDA tool.

Method 500 begins with operation 502, a layout of an integrated circuit is received as an input. In some embodiments, the layout is extracted from a database file of one or more integrated circuit design layouts. In some embodiments, the layout is generated as a Graphic Database System (GDS) file (e.g., a GDSII file). In some embodiments, the layout includes a database file comprising various layers that are drawn to represent the integrated circuit. In some embodiments, the layout includes one or more features of the layouts in FIGS. 1A, 2, 3 and 4.

Figure 5B:
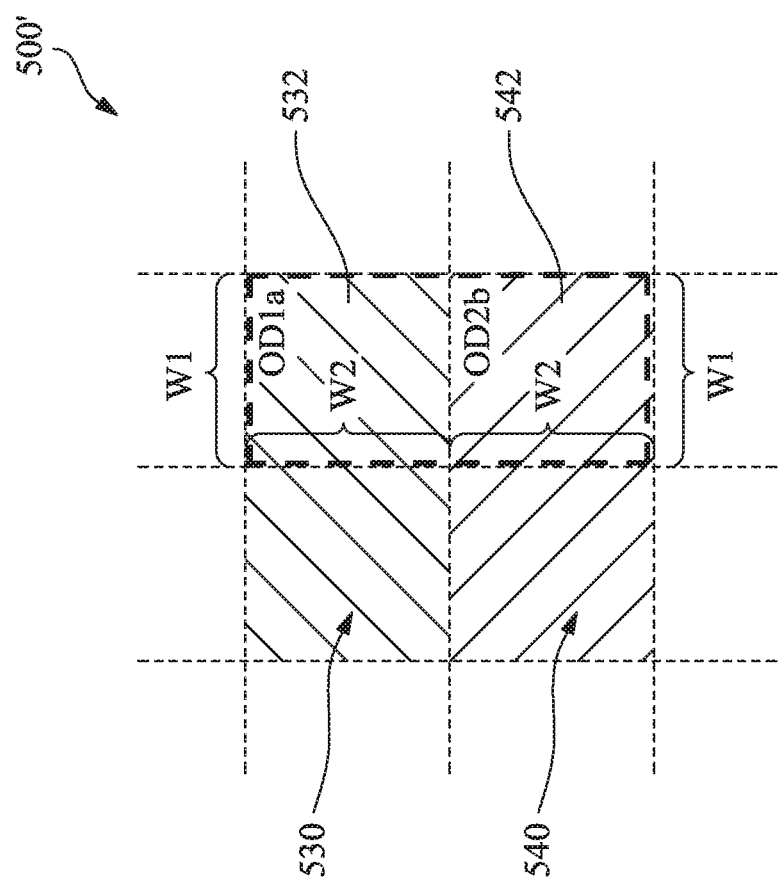
FIG. 5B is a view of a portion of a layout diagram of a semiconductor device in accordance with one or more embodiments.

In operation 504, one or more window parameters and a first threshold are received as an input. In some embodiments, the one or more window parameters include a window length W1 of a window and a window width W2 of the window. A window is an enclosed region of the integrated circuit design (FIG. 5B). In some embodiments, the window length W1 is substantially equal to the window width W2. In some embodiments, the window length W1 different from the window width W2. In some embodiments, the window length W1 is less than about 100 micrometers (μm). If window length W1 is too great, then the semiconductor device formed by method 500 is overdesigned and a size of the semiconductor device is increased without a significant increase in performance of the semiconductor device, in some instances. If window length W1 is too small, then window length W1 fails to capture sufficient area to precisely determine an OD density gradient sufficient to maintain an acceptable manufacturing yield, in some instances. In some embodiments, the window width W2 is less than about 100 μm. If window width W2 is too great, then the semiconductor device formed by method 500 is overdesigned and a size of the semiconductor device is increased without a significant increase in performance of the semiconductor device, in some instances. If window width W2 is too small, then window width W2 fails to capture sufficient area to precisely determine an OD density gradient sufficient to maintain an acceptable manufacturing yield, in some instances. In some embodiments, the one or more window parameters include an area of the region enclosed by the window. In some embodiments, the one or more window parameters include a shape of each window. In some embodiments, the shape of one or more windows is triangular, rectangular, square, hexagonal, or another suitable geometric shape.

In some embodiments, the first threshold defines an upper limit of an OD density gradient between a first window region 502 of a semiconductor device 500' (FIG. 5B) and another window region 504 of the semiconductor device 500' to help ensure a more uniform semiconductor device layout. The first threshold specifies a threshold value that yields a more uniform semiconductor device layout. In some embodiments, the first threshold value is substantially less than or equal to about 30%. In some embodiments, the first threshold value ranges from about 25% to about 35%.

FIG. 5B is a view of a portion of a layout diagram of a semiconductor device 500' in accordance with one or more embodiments. In some embodiments, semiconductor device 500' is similar to semiconductor device 100 in FIG. 1A, semiconductor device 200 in FIG. 2, semiconductor device 300 in FIG. 3, or semiconductor device 400 in FIG. 4.

Semiconductor device 500' is an illustration of a layout diagram of a semiconductor device after operation 508 of method 500 in FIG. 5A.

Semiconductor device 500' includes a first semiconductor region 530 and a second semiconductor region 540. In some embodiments, first semiconductor region 530 is a part of first semiconductor pattern 102 or third semiconductor pattern 106 in FIG. 1A. In some embodiments, second semiconductor region 540 is a part of first semiconductor layout pattern 102 or third semiconductor layout pattern 106.

First semiconductor region 530 includes a window region 532. Window region 532 includes a window length W1 and a window width W2. Window region 532 also includes an OD pattern density OD1$a$.

Second semiconductor region 540 includes an adjacent window region 542. Adjacent window region 542 includes a window length W1 and a window width W2. Adjacent window region 542 includes an OD pattern density OD1$b$.

In operation 506, an OD pattern density of each window region of the integrated circuit is determined. In some embodiments, in operation 506, the integrated circuit design is divided into one or more window regions based on the one or more window parameters. In some embodiments, the OD pattern density of each window region of the integrated circuit is determined based on Formula 1.

In operation 508, an OD pattern density gradient ΔOD between a window region and an adjacent window region is determined. An adjacent window region is a region defined by a window that is within a predetermined distance from the window region. In some embodiments, the adjacent window region is adjacent to the window region. In some embodiments, the adjacent window region is in direct contact with the window region. In some embodiments, the adjacent window region is spaced from the window region.

The OD pattern density gradient ΔOD is represented by Formula 2:

$$\Delta OD = OD\ \text{Pattern Density of window region} - OD\ \text{Pattern Density of adjacent window region} \qquad (2)$$

where ΔOD is a difference between the OD Pattern Density of the window region and the OD Pattern Density of the adjacent window region.

In operation 510, an absolute value of the OD pattern density gradient ΔOD is compared with the first threshold. In some embodiments, operations 508 and 510 are performed for each window region in the integrated circuit design. If the absolute value of the OD pattern density gradient ΔOD is not greater than the first threshold, method 500 proceeds to operation 512. If the absolute value of the OD pattern density gradient ΔOD is greater than the first threshold, method 500 proceeds to operation 514.

In operation 512, a pattern density report is updated to indicate that the received layout passes an OD density check. In some embodiments, the pattern density report includes one or more entries. Each entry of the one or more entries is associated with both a corresponding window region and one or more corresponding OD pattern density values within the corresponding window region which exceed the first threshold. In some embodiments, each entry of the one or more entries is associated with a location of each window region or adjacent window region. In some embodiments, each entry of the one or more entries is associated with a "pass" flag or a "fail" flag. A "pass" flag is an indication that an OD pattern density gradient value ΔOD does not exceed the first threshold. A "fail" flag is an indication that an OD pattern density gradient value ΔOD exceeds the first threshold. In some embodiments, the pattern density report includes a location of each window region or adjacent window region associated with a "pass" flag or a "fail" flag. In some embodiments, if a window region or an adjacent window region is changed (e.g., in operation 516), the location of the change is added to the pattern density report. In some embodiments, if a resistor device is modified to include an incremental resistor device in operation 516, the location of each incremental resistor device is added to the pattern density report. In some embodiments, the pattern density report includes, for each window region associated with a violation, dimensions of the layout patterns within the corresponding window. In some embodiments, an initial pattern density report is generated in operation 512. In some embodiments, the initial pattern density report is generated in an operation other than operation 512 and the pattern density report is updated in operation 512. In some embodiments, the pattern density report is included as a portion of another report, such as a layout versus schematic (LVS) report, a design rule check (DRC) report, or another suitable report.

In operation 514, whether the window region or the adjacent window region includes a resistive device is determined. In some embodiments, a resistive device is at least a portion of the integrated circuit with an equivalent resistance greater than a second threshold value. In some embodiments, the second threshold is input, in operation 502 or 514. In some embodiments, the resistive device includes a semiconductor structure such as third semiconductor layout pattern 106, third semiconductor layout pattern 206, third semiconductor layout pattern 306 or third semiconductor layout pattern 402. If the window region or the adjacent window region includes a resistive device, method 500 proceeds to operation 516. If neither the window region nor the adjacent window region includes a resistive device, method 500 proceeds to operation 518.

In operation 516, at least a portion of the resistive device is replaced with an incremental resistor device. In some embodiments, the incremental resistor device includes a semiconductor structure such as the second semiconductor layout pattern 104, second semiconductor layout pattern 204 or layout pattern 304. In some embodiments, after operation 516, the first layout of the integrated circuit includes one or more of the features of the layout of the semiconductor device 100, 200, 300 or 400 in FIG. 1A, 2, 3 or 4. In some embodiments, the incremental resistor device is between a first portion of the resistive device and a second portion of the resistive device. In some embodiments, a location of the incremental resistor device is flagged for inclusion in the pattern density report in operation 512.

In some embodiments, during operation 516, the incremental resistor device is chosen from a finite number of predetermined incremental resistor layout patterns. In some embodiments, each of the predetermined incremental resistor layout patterns is associated with a corresponding OD pattern density. In some embodiments, method 500 is iterative such that operations 506, 508, 510, 514 and 516 are repeated until the OD pattern density of the incremental resistor device is sufficient to satisfy the comparison in operation 510.

In operation 518, the system a design rule check (DRC) failure is reported. In some embodiments, the DRC failure includes the location of the window region and the location of the adjacent window region of operation 514 that does not include a resistive device. In some embodiments, a DRC failure is a part of a DRC failure report. The DRC failure report includes one or more DRC entries. Each entry of the one or more DRC entries is associated with both a corresponding window region and one or more corresponding OD pattern density values within the corresponding window region which exceed the first threshold and do not include a resistive device. In some embodiments, the DRC failure report includes a location of each window region associated with the violation. In some embodiments, the DRC failure report is generated in operation 518. In some embodiments, the DRC failure report is generated in an operation other than operation 518. In some embodiments, the DRC failure report is a portion of another report.

Figure 6:
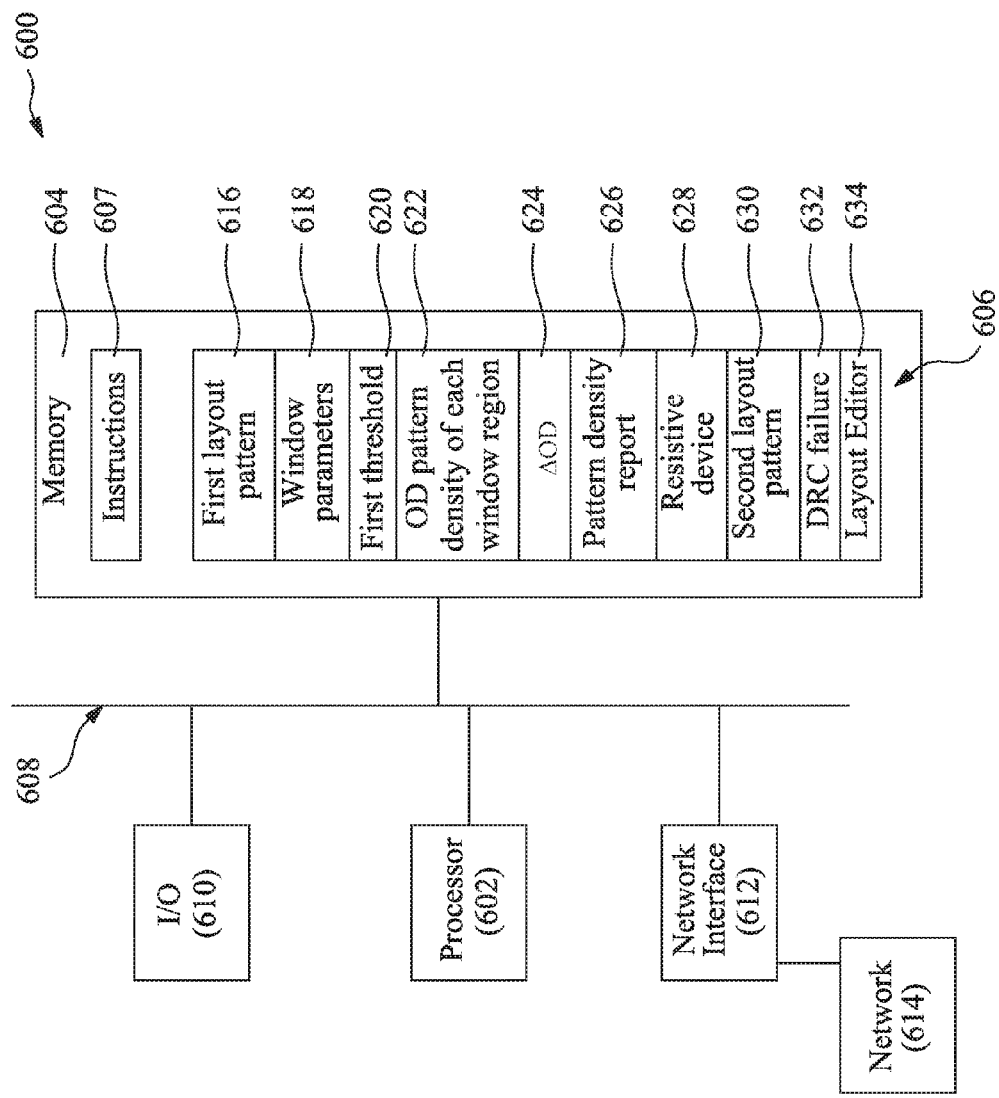
FIG. 6 is a block diagram of a specific purpose system for designing a semiconductor device in accordance with one or more embodiments.

FIG. 6 is a block diagram of a specific purpose system for designing a semiconductor device in accordance with one or more embodiments. In some embodiments, the system 600 is a specific purpose computing device which implements method 500 of FIG. 5A in accordance with one or more embodiments. Control system 600 includes a hardware processor 602 and a non-transitory, computer readable storage medium 604 encoded with, i.e., storing, the computer program code 606, i.e., a set of executable instructions. Computer readable storage medium 604 is also encoded with instructions 607 for interfacing with manufacturing machines for producing the integrated circuit or semiconductor device. The processor 602 is electrically coupled to the computer readable storage medium 604 via a bus 608. The processor 602 is also electrically coupled to an I/O interface 610 by bus 608. A network interface 612 is also electrically connected to the processor 602 via bus 608. Network interface 612 is connected to a network 614, so that processor 602 and computer readable storage medium 604 are capable of connecting to external elements via network 614. The processor 602 is configured to execute the computer program code 606 encoded in the computer readable storage medium 604 in order to cause system 600 to be usable for performing a portion or all of the operations as described e.g., in method 500.

In one or more embodiments, the processor 602 is a central processing unit (CPU), a multi-processor, a distributed processing system, an application specific integrated circuit (ASIC), and/or a suitable processing unit.

In one or more embodiments, the computer readable storage medium 604 is an electronic, magnetic, optical, electromagnetic, infrared, and/or a semiconductor system (or apparatus or device). For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium 604 includes a compact disk-read only memory (CD-ROM), a compact disk-read/write (CD-R/W), and/or a digital video disc (DVD).

In one or more embodiments, the storage medium 604 stores the computer program code 606 configured to cause system 600 to perform method 500. In one or more embodiments, the storage medium 604 also stores information needed for performing method 500 as well as information generated during performing method 500, such as first layout pattern 616, window parameters 618, first threshold 620, OD pattern density of each window region 622, ΔOD 624, pattern density report 626, resistive device 628, second layout pattern 630, DRC failure 632, layout editor 634, and/or a set of executable instructions to perform the operation of method 500.

In one or more embodiments, the storage medium 604 stores instructions 607 for interfacing with external machines. The instructions 607 enable processor 602 to generate instructions readable by the external machines to effectively implement method 500 during a design process. In some embodiments, the design process is of a semiconductor device including one or more integrated circuit elements. In some embodiments, the design process comprises checking an OD pattern density of a design of an integrated circuit or a semiconductor device.

Control system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

Control system 600 also includes network interface 612 coupled to the processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1394. In one or more embodiments, method 500 is implemented in two or more systems 600, and information such as first layout pattern 616, window parameters 618, first threshold 620, OD pattern density of each window region 622, ΔOD 624, pattern density report 626, resistive device 628, second layout pattern 630, DRC failure 632, layout editor 634 are exchanged between different systems 600 via network 614.

Control system 600 is configured to receive information related to a UI through I/O interface 610. The information is transferred to processor 602 via bus 608 to generate first layout pattern. The UI is then stored in computer readable medium 604 as first layout pattern 616. Control system 600 is configured to receive information related to one or more window parameters through I/O interface 610. The information is stored in computer readable medium 604 as window parameters 618. Control system 600 is configured to receive information related to a first threshold through I/O interface 610. The information is stored in computer readable medium 604 as first threshold 620. Control system 600 is configured to receive information related to an OD pattern density of each window region through I/O interface 610. The information is stored in computer readable medium 604 as OD pattern density of each window region 622. Control system 600 is configured to receive information related to a ΔOD through I/O interface 610. The information is stored in computer readable medium 604 as ΔOD 624. Control system 600 is configured to receive information related to a pattern density report through I/O interface 610. The information is stored in computer readable medium 604 as pattern density report 626. Control system 600 is configured to receive information related to a resistive device through I/O interface 610. The information is stored in computer readable medium 604 as resistive device 628. Control system 600 is configured to receive information related to a second layout pattern through I/O interface 610. The information is stored in computer readable medium 604 as second layout pattern 630. Control system 600 is configured to receive information related to a DRC failure through I/O interface 610. The information is stored in computer readable medium 604 as DRC failure 632. Control system 600 is configured to receive information related to a layout editor through I/O interface 610. The information is stored in computer readable medium 604 as layout editor 634.

One aspect of this description relates to a method of manufacturing a semiconductor device. The method includes determining an active region pattern density of a first region of an integrated circuit layout based on a total area of each active region in the first region and an area of the first region, wherein the first region is defined by a first window. The method further includes determining an active region pattern density of a second region of the integrated circuit layout based on a total area of each active region in the second region and an area of the second region, wherein the second region is defined by a second window and is adjacent to the first region. The method further includes determining, using at least one processor, an active region pattern density gradient between the first region to the second region based on the active region pattern density of the first region and the active region pattern density of the second region. The method further includes determining whether the first region or the second region includes a resistive device. The method further includes modifying a portion of the resistive device to include an incremental resistor in response to the first region or the second region including the resistive device.

Another aspect of this description relates to a method of manufacturing an integrated circuit. The method includes receiving a layout of the integrated circuit. The method further includes receiving a threshold value. The method further includes determining an active region pattern density of a first region of the integrated circuit layout based on a total area of each active region in the first region and an area of the first region, wherein the first region is defined by a first window. The method further includes determining an active region pattern density of a second region of the integrated circuit layout based on a total area of each active region in the second region and an area of the second region, wherein the second region is defined by a second window and is adjacent to the first region. The method further includes determining, using at least one processor, an active region pattern density gradient between the first region to the second region based on the active region pattern density of the first region and the active region pattern density of the second region. The method further includes determining whether an absolute value of the active region pattern density gradient exceeds the threshold value. The method further includes determining whether the first region or the second region includes a resistive device. The method further includes modifying a portion of the resistive device to include an incremental resistor in response to the first region or the second region including the resistive device and the absolute value of the active region pattern density gradient exceeding the threshold value.

Still another aspect of this description relates to a system for manufacturing a semiconductor device. The system includes a processor and a non-transitory computer readable medium connected to the processor. The processor is configured to execute instructions store on the non-transitory computer readable medium for determining an active region pattern density of a first region of an integrated circuit layout based on a total area of each active region in the first region and an area of the first region, wherein the first region is defined by a first window. The processor is further configured to determine an active region pattern density of a second region of the integrated circuit layout based on a total area of each active region in the second region and an area of the second region, wherein the second region is defined by a second window and is adjacent to the first region. The processor is further configured to determine an active region pattern density gradient between the first region to the second region based on the active region pattern density of the first region and the active region pattern density of the second region. The processor is further configured to determine whether the first region or the second region includes a resistive device. The processor is further configured to modify a portion of the resistive device to include an incremental resistor in response to the first region or the second region including the resistive device. The processor is further configured to interface with manufacturing machines for manufacturing the semiconductor device.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   determining an active region pattern density of a first region of an integrated circuit layout based on a total area of each active region in the first region and an area of the first region, wherein the first region is defined by a first window;
   determining an active region pattern density of a second region of the integrated circuit layout based on a total area of each active region in the second region and an area of the second region, wherein the second region is defined by a second window and is adjacent to the first region;
   determining, using at least one processor, an active region pattern density gradient between the first region to the second region based on the active region pattern density of the first region and the active region pattern density of the second region;
   modifying a portion of a resistive device in at least one of the first region or the second region to include an incremental resistor; and
   determining the active region pattern density of the first region and the active region pattern density of the second region following the modifying of the portion of the resistive device.

2. The method of claim 1, further comprising reporting a design rule check failure in response to the first region and the second region not including the resistive device and an absolute value of the active region pattern density gradient exceeding a first threshold value.

3. The method of claim 1, further comprising updating a pattern density report comprising a location of the incremental resistor in response to the first region or the second region including the resistive device.

4. The method of claim 1, further comprising determining the active region pattern density gradient based on the resistive device including the modified portion of the resistive device.

5. The method of claim 1, further comprising determining whether an absolute value of the active region pattern density gradient exceeds a first threshold value, wherein the first threshold value ranges from about 25% to about 35%.

6. The method of claim 5, wherein modifying the portion of the resistive device comprises modifying the portion of the resistive device in response to the absolute value of the active region pattern density gradient exceeding the first threshold value.

7. The method of claim 1, wherein modifying the portion of the resistive device comprises placing the incremental resistor between a first portion of the resistive device and a second portion of the resistive device.

8. The method of claim 1, wherein modifying the portion of the resistive device comprises selecting the incremental resistor from a finite number of predetermined incremental resistor layout patterns.

9. The method of claim 8, wherein selecting the incremental resistor comprises selecting the incremental resistor based on the active region pattern density of the second region.

10. A method of manufacturing an integrated circuit, the method comprising:
    receiving a layout of the integrated circuit;
    receiving a threshold value;
    determining an active region pattern density of a first region of the integrated circuit layout based on a total area of each active region in the first region and an area of the first region, wherein the first region is defined by a first window;
    determining an active region pattern density of a second region of the integrated circuit layout based on a total area of each active region in the second region and an area of the second region, wherein the second region is defined by a second window and is adjacent to the first region;
    determining, using at least one processor, an active region pattern density gradient between the first region to the second region based on the active region pattern density of the first region and the active region pattern density of the second region;
    determining whether an absolute value of the active region pattern density gradient exceeds the threshold value; and
    modifying a portion of a resistive device in at least one of the first region or the second region to include an incremental resistor in response to the absolute value of the active region pattern density gradient exceeding the threshold value, wherein the modifying of the portion of the resistive device comprises reducing the absolute value of the active region pattern density gradient to be below the threshold value.

11. The method of claim 10, further comprising receiving at least one window parameter, wherein the at least one window parameter determines dimensions of the first region of the integrated circuit, and dimensions of the second region of the integrated circuit.

12. The method of claim 10, further comprising outputting an indication that the received layout of the integrated circuit satisfies pattern density requirements in response to the absolute value of the active region pattern density gradient being equal to or less than the threshold value.

13. The method of claim 10, further comprising outputting an indication that the integrated circuit including the modified portion of the resistive device satisfies pattern density requirements in response to the absolute value of the active region pattern density gradient being equal to or less than the threshold value.

14. The method of claim 13, wherein outputting the indication comprises outputting a location of the incremental resistor.

15. The method of claim 10, further comprising:
determining the active region pattern density of the first region of the integrated circuit layout based on the resistive device including the incremental resistor;
determining the active region pattern density of the second region of the integrated circuit layout based on the resistive device including the incremental resistor;
determining the active region pattern density gradient between the first region to the second region based on the resistive device including the incremental resistor; and
determining whether the absolute value of the active region pattern density gradient based on the resistive device including the incremental resistor exceeds the threshold value.

16. The method of claim 15, further comprising outputting an indication that the integrated circuit including the incremental resistor satisfies pattern density requirements in response to the absolute value of the active region pattern density gradient based on the resistive device including the incremental resistor being equal to or less than the threshold value.

17. A method of manufacturing a semiconductor device, the method comprising:
determining an active region pattern density of a first region of an integrated circuit layout based on a total area of each active region in the first region and an area of the first region, wherein the first region is defined by a first window;
determining an active region pattern density of a second region of the integrated circuit layout based on a total area of each active region in the second region and an area of the second region, wherein the second region is defined by a second window and is adjacent to the first region;
determining an active region pattern density gradient between the first region to the second region based on the active region pattern density of the first region and the active region pattern density of the second region;
modifying a portion of a resistive device of at least one of the first region or the second region to include an incremental resistor; and
manufacturing the semiconductor device comprising the incremental resistor.

18. The method of claim 17, further comprising storing a plurality of predefined incremental resistors.

19. The method of claim 18, further comprising selecting the incremental resistor from the plurality of predefined incremental resistors based on the active region pattern density gradient.

20. The method of claim 17, further comprising comparing an absolute value of the active region pattern density gradient with a first threshold value.

* * * * *